(12) United States Patent
Brandl

(10) Patent No.: US 11,474,746 B2
(45) Date of Patent: Oct. 18, 2022

(54) REFRESH MANAGEMENT FOR DRAM

(71) Applicant: Advanced Micro Devices, Inc., Santa Clara, CA (US)

(72) Inventor: Kevin M. Brandl, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/118,034

(22) Filed: Dec. 10, 2020

(65) Prior Publication Data
US 2022/0188024 A1 Jun. 16, 2022

(51) Int. Cl.
G06F 3/06 (2006.01)

(52) U.S. Cl.
CPC .......... G06F 3/0659 (2013.01); G06F 3/0604 (2013.01); G06F 3/0673 (2013.01)

(58) Field of Classification Search
CPC ..... G06F 3/0659; G06F 3/0604; G06F 3/0673
See application file for complete search history.

(56) References Cited

U.S. PATENT DOCUMENTS

| | | | |
|---|---|---|---|
| 2015/0200002 A1* | 7/2015 | Lin .................... | G11C 11/40618 711/106 |
| 2015/0206558 A1* | 7/2015 | Ni ......................... | G11C 11/408 711/106 |
| 2017/0110178 A1* | 4/2017 | Bains .................. | G11C 11/4093 |
| 2017/0133085 A1* | 5/2017 | Kim ...................... | G06F 3/0619 |
| 2019/0073161 A1* | 3/2019 | Nale ...................... | G06F 3/0659 |
| 2019/0228813 A1* | 7/2019 | Nale ...................... | G06F 3/0659 |
| 2020/0005857 A1* | 1/2020 | Ito ......................... | G11C 11/4076 |
| 2020/0043545 A1* | 2/2020 | Gans ................ | G11C 11/40615 |
| 2020/0129152 A1* | 4/2020 | Jain ...................... | G01S 15/8915 |
| 2021/0049269 A1* | 2/2021 | Ghosh .................... | G06F 21/79 |

OTHER PUBLICATIONS

Moyer, Bryon; DRAM's Persistent Threat to Chip Security; Feb. 10, 2021; semiengineering.com; available at: https://semiengineering.com/drams-peristent-threat-to-chip-security/ (Year: 2021).*
Vaughan-Nichols, Steven; "Rowhammer Memory Attacks Close in on the Real World;" May 11, 2020; Insider Pro; available at: https://www.idginsiderpro.com/article/3529519/rowhammer-memory-attacks-close-in-on-the-real-world.html (Year: 2020).*

* cited by examiner

*Primary Examiner* — Ryan Bertram
(74) *Attorney, Agent, or Firm* — Polansky & Associates, P.L.L.C.; Paul J. Polansky; Nathan H. Calvert

(57) ABSTRACT

A memory controller interfaces with a dynamic random access memory (DRAM). The memory controller selectively places memory commands in a memory interface queue and transmits the memory commands from the memory interface queue to a memory channel coupled to at least one dynamic random access memory (DRAM). An activate counter is maintained related to a number of activate commands sent over the memory channel to a memory region of the DRAM. In response to the activate counter being at or above a designated threshold, an arbiter is signaled that a refresh command should be sent to the memory region. In response to a designated condition, a value of the activate counter is adjusted by a total number based on a first fixed number and second varying number selected with one of random selection and pseudo-random selection.

20 Claims, 4 Drawing Sheets

REFRESH MANAGEMENT FOR DRAM

BACKGROUND

Computer systems typically use inexpensive and high-density dynamic random access memory (DRAM) chips for main memory. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store one to eight gigabits (Gb) of data using deep sub-micron technology. Because of the high density and small feature size, rows of the memory are so physically close to other rows that the activation of a particular row can upset data stored in adjacent rows by changing the charge on the memory cell capacitors. In the past, these upsets were typically harmless because the memory cells are refreshed periodically. However, occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles. As feature sizes become smaller, this problem, known as "row hammer", becomes harder to mitigate because the number of row activates required to cause the problem becomes smaller.

Furthermore, one of the most common mitigation techniques for the row hammer problem, the targeted row refresh (TRR), has been shown to be vulnerable to malicious row hammer attacks based on attack patterns that are aware of the refresh pattern employed on the DRAM chip, and use many aggressor rows to accomplish the attack.

Figure 1:
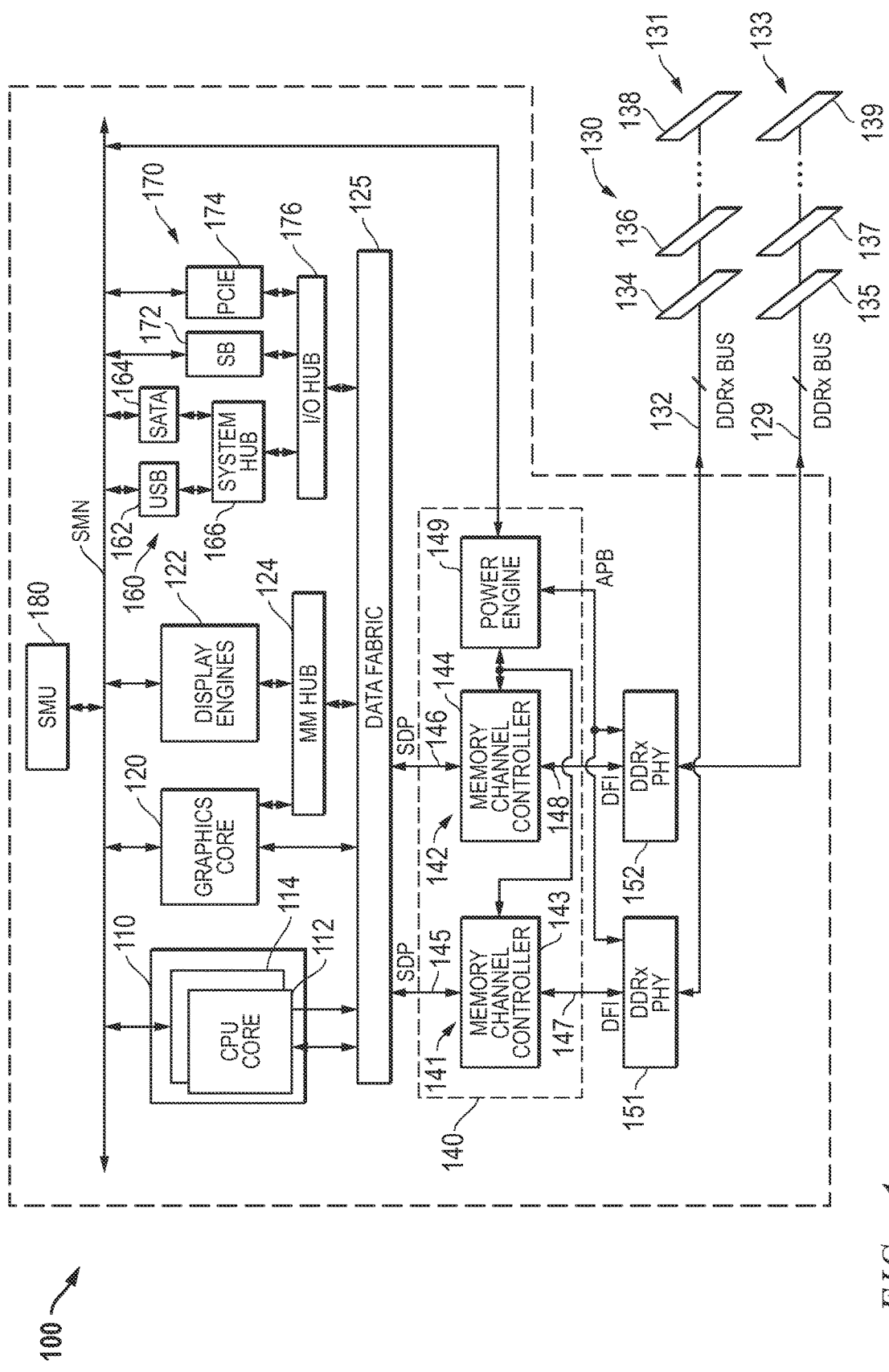
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a memory interface queue, an arbiter, a refresh control circuit, and an activate counter adjustment circuit. The memory interface queue has an output coupled a memory channel adapted for coupling to at least one dynamic random access memory (DRAM). The arbiter is coupled to the memory interface queue for selecting memory commands and placing them in the memory interface queue to be transmitted over the memory channel. The refresh control circuit is coupled to the arbiter and operable to monitor an activate counter which maintains a count related to a number of activate commands sent over the memory channel to a memory region, and in response to the activate counter being above a designated threshold, signal the arbiter that a refresh command should be sent to the memory region. The activate counter adjustment circuit is coupled to the activate counter and operable to respond to a designated condition by adjusting a value of the activate counter by a total number based on a first fixed number and second varying number selected with one of random selection and pseudo-random selection.

A method includes selectively placing memory commands in a memory interface queue and transmitting the memory commands from the memory interface queue to a memory channel coupled to at least one dynamic random access memory (DRAM). An activate counter is maintained related to a number of activate commands sent over the memory channel to a memory region of the DRAM. In response to the activate counter being at or above a designated threshold, the method signals an arbiter that a refresh command should be sent to the memory region. In response to a designated condition, the method adjusts a value of the activate counter by a total number based on a first fixed number and second varying number selected with one of random selection and pseudo-random selection.

A data processing system includes a data processor, a data fabric coupled to the data processor, and a memory controller coupled to the data fabric for fulfilling memory requests from the data processor. The memory controller includes a memory interface queue, an arbiter, a refresh control circuit, and an activate counter adjustment circuit. The memory interface queue has an output coupled a memory channel adapted for coupling to at least one dynamic random access memory (DRAM). The arbiter is coupled to the memory interface queue for selecting memory commands and placing them in the memory interface queue to be transmitted over the memory channel. The refresh control circuit is coupled to the arbiter and operable to monitor an activate counter which maintains a count related to a number of activate commands sent over the memory channel to a memory region, and in response to the activate counter being above a designated threshold, signal the arbiter that a refresh command should be sent to the memory region. The activate counter adjustment circuit is coupled to the activate counter and operable to respond to a designated condition by adjusting a value of the activate counter by a total number based on a first fixed number and second varying number selected with one of random selection and pseudo-random selection.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180. As will be appreciated by a person of ordinary skill APU 100 may not have all of these elements present in every embodiment and, further, may have additional elements included therein. Furthermore, APU 100 may be constructed of one or multiple integrated circuits in a system.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
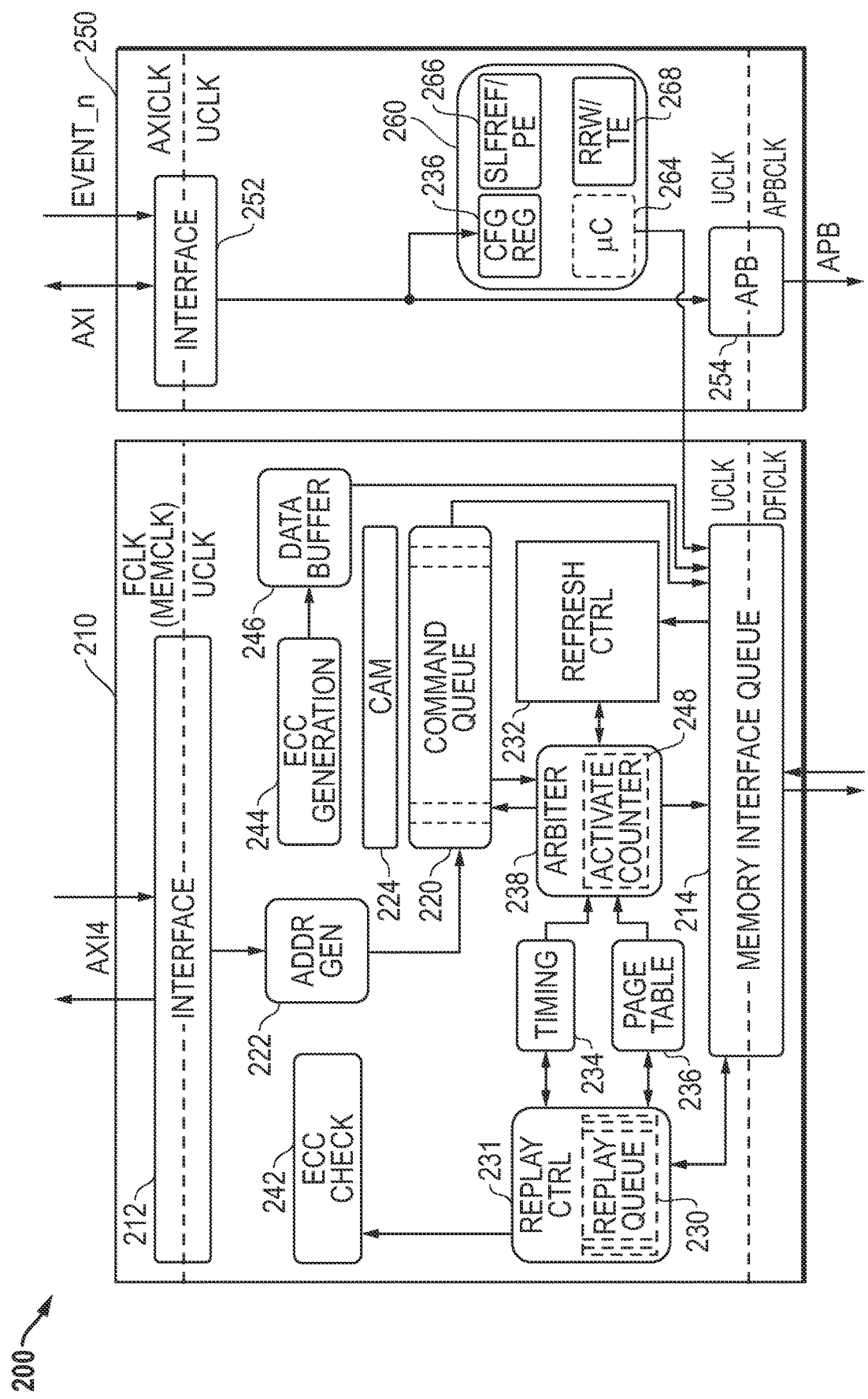
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a recovery sequence in which accesses are replayed in the case of a parity or ECC error of one of these cycles. Replayed commands are placed in the memory interface queue 214.

Refresh control logic 232 includes state machines for various power down, refresh, and termination resistance (ZQ) calibration cycles that are generated separately from normal read and write memory access requests received from memory accessing agents. For example, if a memory rank is in precharge power down, it must be periodically awakened to run refresh cycles. Refresh control logic 232 generates refresh commands periodically and in response to designated conditions to prevent data errors caused by leaking of charge off storage capacitors of memory cells in DRAM chips. The memory regions are memory banks in some embodiments, and memory sub-banks in other embodiments as further discussed below. Refresh control logic 232 also generates refresh commands, which include both refresh (REF) commands and refresh management (RFM) commands, in which the RFM commands direct the memory to perform refresh functions for mitigating row hammer issues as further described below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210. Arbiter 238 improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230. Arbiter 238 includes an activate counter 248, which in this embodiment includes a counter for each memory region and counts a number of activate commands sent over the memory channel to a memory region. Arbiter 238 is bidirectionally connected to refresh control logic 232 to monitor refresh commands and direct refresh activities.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
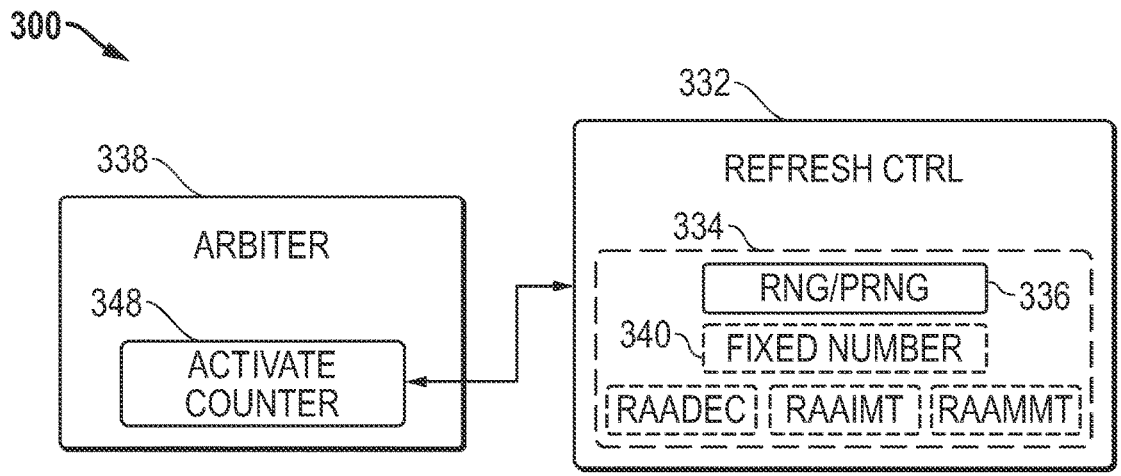
FIG. 3 is a block diagram of a partial memory controller according to some embodiments.

FIG. 3 illustrates in block diagram form a partial memory controller 300 including an arbiter 338 and a refresh control circuit 332. Arbiter 338 and refresh control circuit 332 may be employed in memory controller 200 of FIG. 2 to implement portions of arbiter 239 and refresh control circuit 232, or another suitable memory controller that uses an activate counter to assist in the memory refresh process.

Arbiter 338 includes an activate counter 348 which maintains a count related to the number of activate (ACT) commands sent over the memory channel to a particular memory region. Refresh control circuit 332 is coupled to activate counter 348 to monitor the counter value and in response to activate counter 348 being above a designated threshold, signal arbiter 338 that a refresh command should be sent to the memory region.

Refresh control circuit 332 includes an activate counter adjustment circuit 334 coupled to activate counter 348 and operable to respond to a designated condition by adjusting a value of activate counter 348 by a total number based on a first fixed number 340 and second varying number selected with one of random selection and pseudo-random selection. A random number generator or pseudo-random number generator (RNG/PRNG) 336 provides a randomly-generated number, which is employed directly or indirectly to select the second varying number.

Activate counter adjustment circuit 334 is in communication with configuration registers holding values for controlling the refresh management process, including the depicted RAAIMT (Rolling Accumulated ACT Initial Management Threshold) and RAAMMT (Rolling Accumulated ACT Maximum Management Threshold) values. The RAAIMT indicates an activate counter value at which the threat of row hammer issues is elevated but not yet critical. The RAAMMT value indicates an activate counter value at the threat of row hammer issues is considered critical. As discussed with respect to FIG. 4, these thresholds influence the behavior of refresh control circuit 332 in issuing REF and RFM commands. A Rolling Accumulated ACT Decrement value RAADEC is also shown, which holds a maximum value by which activate counter 348 is decremented when a REF or RFM command is issued. The value of RAADEC in some versions is determined as a ratio relative to the RAAMMT or RAAIMT. The functioning of refresh control circuit 332 is further described with respect to FIGS. 4-6.

Figure 4:
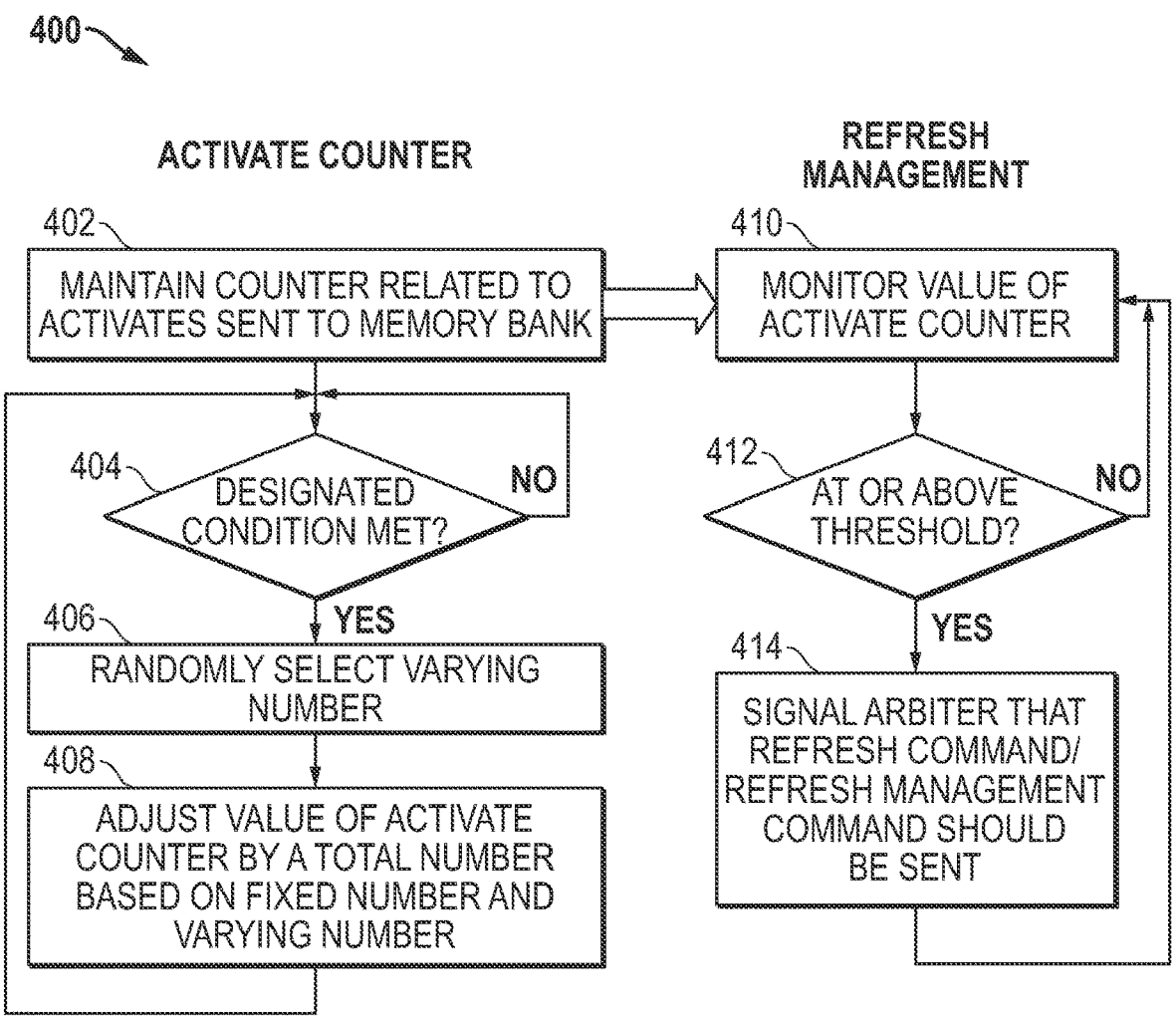
FIG. 4 shows a flow diagram of a process for operating a refresh management circuit according to some embodiments.

FIG. 4 shows a flow diagram 400 of a process for operating a refresh management circuit according to some embodiments. The process may be performed with refresh management circuit 332 (FIG. 3) or other suitable circuits coupled to a command arbiter and an activate counter.

At block 402, the process maintains an activate counter such as activate counter 348 of FIG. 3 related to a number of ACT commands sent to a memory bank or sub bank. In some embodiments, the activate counter counts the number of ACT commands sent, while in other embodiments the counter is not incremented one-for-one with each ACT command, as further discussed below.

While maintaining the activate counter, the process at block 404 monitors the arbiter such as arbiter 338 of FIG. 3 to determine if a designated condition is met. In some embodiments, the designated condition is the issuance of a refresh command (REF) or refresh management command (RFM) to the memory region for which the activate counter is responsible. In other embodiments, the designated condition is the issuance of an ACT command to the memory region for which the activate counter is responsible. Still other embodiments include other designated conditions. More than one condition is required in some embodiments. Until the designated condition is met, the process continues maintaining the counter and waiting for the designated condition to be met. When the designated condition is met, the process goes to block 406, where it randomly selects a varying number. The random selection in some embodiments is done directly by a RNG/PRNG, and in other embodiments the outcome of a RNG/PRNG is mapped onto a designated range of numbers to make the random selection.

At block 408, the process adjusts the value of the activate counter by a total number based on a fixed number and the varying number selected at block 406. The value adjustment in some embodiments is a decrement of the activate counter value. In other embodiments the activate counter is incremented. After adjusting the value of the activate counter, the process returns to block 404 to continue checking if the designated condition is met again.

Concurrently, the process at block 410 monitors the value of the activate counter for determining if the risk of row hammer issues needs mitigation. As shown at block 412, the process determines if the activate counter value is at or above a designated threshold, such as the RAAMMT value. If not, the process continues to monitor the activate counter. If so, the process goes to block 414 where it signals the arbiter that a REF or RFM should be sent to the relevant memory region.

Figure 5:
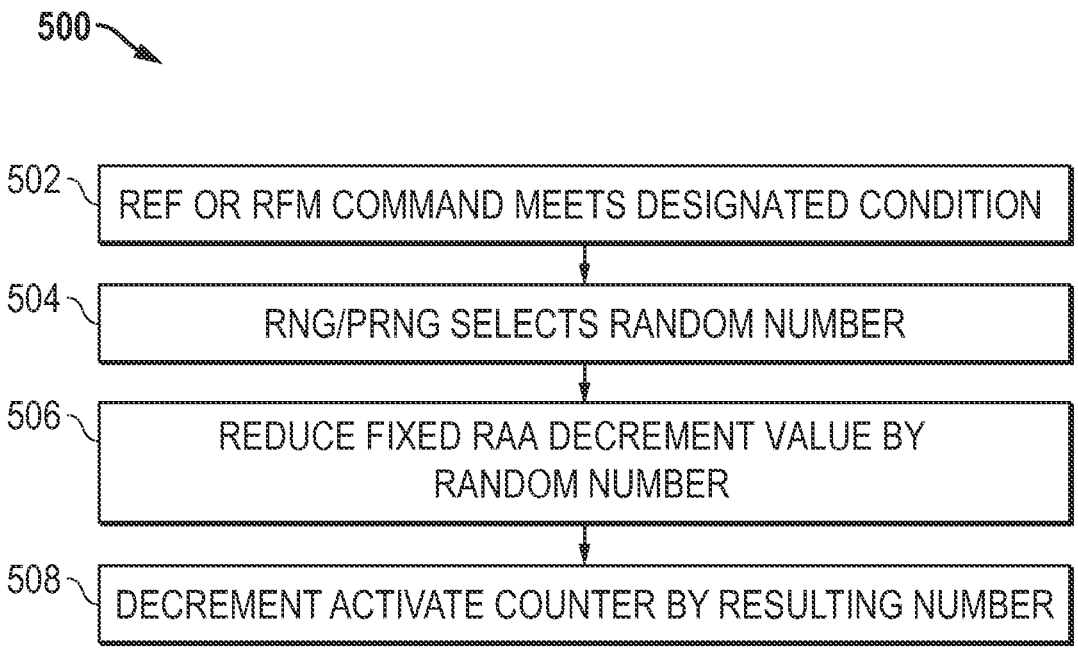
FIG. 5 shows a flow diagram of a process for operating an activate counter adjustment circuit.

FIG. 5 shows a flow diagram 500 of a process for operating an activate counter adjustment circuit 334 (FIG. 3). In this embodiment, the process monitors for a designated condition of a refresh command or a refresh management command being sent to the relevant memory region. When this condition is met at block 502, the process at block 504 selects a random number using RNG/PRNG 336.

Then at block 506, the process uses the random number to reduce the value of a first fixed number, which is typically an rolling activate accumulate decrement (RAADEC) value or a scaled version of the RAADEC. At block 508, the resulting value is decremented from the value of the activate counter. By randomly adjusting the RAADEC, the process alters the RAA decrement values such that the time between DRAM commands is sufficiently random and difficult to otherwise determine from side-channel methods that might be used in a malicious row hammer attack. The result of such adjustment is that the time between ACT and REF and/or RFM commands will appear random and slightly more frequent than dictated by JEDEC specifications but without significant impact to overall system performance.

This randomization mechanism, and that of FIG. 5, has the advantages that it abides by the JEDEC RAA accounting rules, but adds an additional randomization element to discourage access pattern steering which may maliciously attempt to bypass refresh control techniques. These randomization mechanisms also help to mitigate against malicious attack methodologies that are based on an awareness of internal DRAM mechanisms such as targeted row refresh.

While in the disclosed embodiment a randomly determined value is subtracted from the RAADEC value at block 506, other methods of providing the same effect of randomly varying the RAADEC within a desired range are used in other embodiments. For example, the random number generated at block 504 is used to directly select the amount to decrement the activate counter from a designated range (i.e., without a subtraction operation involved). The selected amount is based on a first fixed number related to the fixed RAADEC value, and a second varying number randomly selected. In another example, the value of the activate counter is set directly with a total number based on a first fixed number and second varying number.

Figure 6:
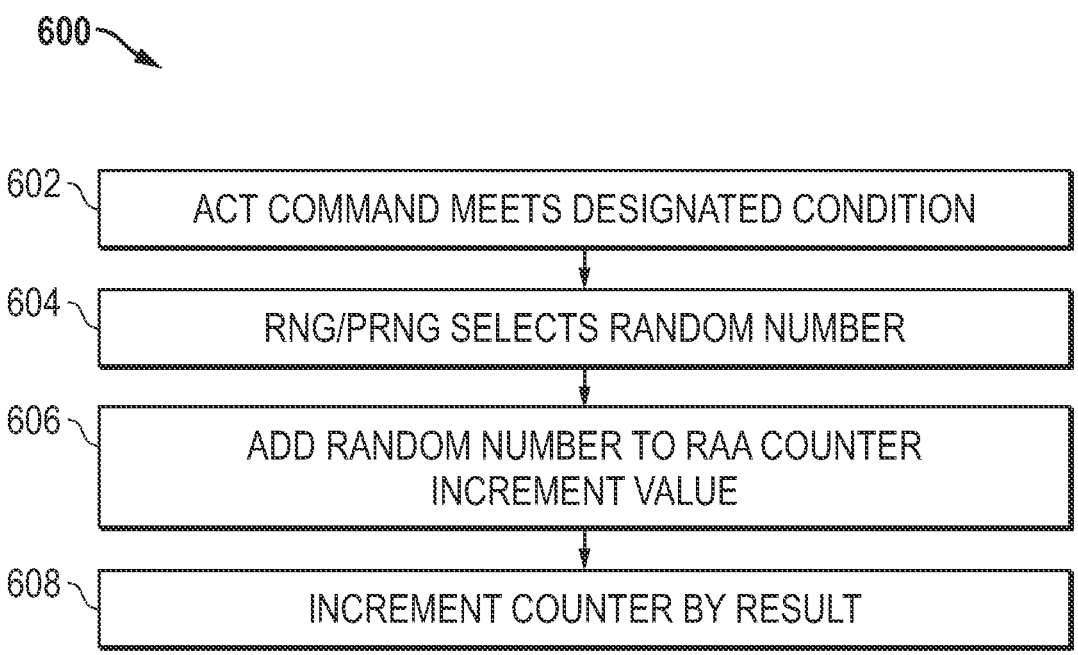
FIG. 6 shows a flow diagram of another process for operating an activate counter adjustment circuit.

In some embodiments, the range of random variation is selected to provide a desired bias to the random variation. Such a bias is implemented, in the subtraction based adjustment described above, by selecting the second varying number from a numerical range comprising "1" to a bias value less than the first fixed number. For example, if the RAADEC has a value of 100, the range of random variation in the total number used to adjust the activate counter may be from 50 to 100, thus biasing the random variation of the activate counter decrement toward a larger, and therefore less frequent, decrement. In other embodiments, no bias is used, and the second varying number is selected from a numerical range comprising "1" to no greater than the first fixed number. The particular range can be varied in different embodiments, and may start at "0" or another number. As can be understood, the particular method of calculation is not important, and a desired bias may be achieved with any suitable method based on random selection varying a range provided relative to a first fixed number. For example, another embodiment FIG. 6 shows a flow diagram 600 of another process for operating an activate counter adjustment circuit 334 (FIG. 3). In this embodiment, a random variation of the REF/RFM command frequency is achieved through random variation of the activate counter increment rather than the activate counter decrement.

The process monitors for a designated condition of an activate command being sent to the memory region as shown at block 602. When the designated condition is met, the process at block 604 selects a random number using the RNG/PRNG 336. In this embodiment, the randomly selected number may be "0", "1", or "2". Another embodiment selects from values of "0" and "1". At block 606, the process adds the randomly selected number to fixed number, an RAA increment value which is typically "1". At block 608, the process increments the activate counter by the total, thus resulting in a randomly varying increment to the activate counter rather than the normal fixed, single increment for each activate command that is issued.

While this embodiment adds a random number to the RAA increment value, other embodiments achieve the same effect of random variation with different. For example, the RNG/PRNG 336 may be coupled to a counter increment activation circuit in a manner to designed to provide a random chance to activate an additional increment to the activate counter whenever the activate counter is incremented, thus adjusting the value of the activate counter by a total number based on a first fixed number and second varying number. A similar random variation may be achieved by selecting the increment value directly, without using addition, from a range biased upward by the fixed number of "1". For example, instead of randomly selecting "0" or "1" to be added to an increment, the process may directly select the increment to be "1" or "2".

While the depicted process blocks in FIGS. 4-6 are shown in order, this order is not limiting, and the depicted logical functionality, or its logical equivalent, is typically accomplished by various digital logic circuits operating in parallel. In various embodiments, digital logic circuits perform the activate counter monitoring in various ways.

In various embodiments, the memory region for which an activate counter is monitored and randomly adjusted by activate counter adjustment circuit is a memory bank or a sub-bank. When the memory region is a sub-bank of a memory bank, and the refresh control circuit is operable to monitor multiple activate counters for respective multiple sub-banks of the memory bank and apply REF and RFM commands at the bank level. Such commands cause an update of all the sub-bank activate counters for sub-banks within the bank. Similarly, all bank REF commands cause an update of sub-bank activate counters for all sub-banks within the respective rank. As such, process is operable to monitor the activate counters at a granularity level of the multiple sub-banks, and allow or cause the REF and RFM commands to issue at a granularity level of the selected memory bank. The refresh control circuit may be configurable to provide activate counters for memory banks or sub-banks, with the refresh management process also adjustable to account for banks or sub-banks.

Memory controller 200 of FIG. 2 or any portions thereof, such as arbiter 238 and refresh control circuit 232, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller, comprising:
a memory interface queue having an output coupled to a memory channel adapted for coupling to at least one dynamic random access memory (DRAM);
an arbiter coupled to the memory interface queue for selecting memory commands and placing them in the memory interface queue to be transmitted over the memory channel;
a refresh control circuit coupled to the arbiter and operable to monitor an activate counter which maintains a count related to a number of activate commands sent over the memory channel to a memory region, and in response to the activate counter being above a designated threshold, signal the arbiter that a refresh command should be sent to the memory region; and
an activate counter adjustment circuit coupled to the activate counter and operable to respond to a designated condition by adjusting a value of the activate counter by a total number based on a first fixed number and second varying number selected with one of random selection and pseudo-random selection.

2. The memory controller of claim 1, wherein:
the designated condition is that one of a refresh command and a refresh management command is sent to the memory region; and
the total number is produced by reducing the first fixed number by the second varying number; and
adjusting the value of the activate counter comprises decrementing the activate counter by the total number.

3. The memory controller of claim 2, wherein the second varying number is selected from a numerical range comprising "1" to no greater than the first fixed number.

4. The memory controller of claim 2, wherein the second varying number is selected from a numerical range comprising "1" to a value less than the first fixed number and selected to bias random variation of the activate counter adjustment toward a larger, and therefore less frequent, decrement.

5. The memory controller of claim 1, wherein the first fixed number is a Rolling Accumulated Activate (RAA) decrement value provided in a control register for the memory controller.

6. The memory controller of claim 1, wherein:
the designated condition is that an activate command is sent to the memory region; and
the first fixed number is "1", the second varying number is selected from a set of values including at least "0" and "1", and the total number is the first fixed number plus the second varying number; and
adjusting the value of the activate counter comprises adding the total number to a previous value of the activate counter.

7. The memory controller of claim 1, further comprising a pseudo-random number generator (PRNG) coupled to the activate counter adjustment circuit for selecting the second varying number.

8. A method, comprising:
selectively placing memory commands in a memory interface queue and transmitting the memory commands from the memory interface queue to a memory channel coupled to at least one dynamic random access memory (DRAM);
maintaining an activate counter related to a number of activate commands sent over the memory channel to a memory region of the DRAM;
in response to the activate counter being at or above a designated threshold, signaling an arbiter that a refresh command should be sent to the memory region; and
in response to a designated condition, adjusting a value of the activate counter by a total number based on a first fixed number and second varying number selected with one of random selection and pseudo-random selection.

9. The method of claim 8, wherein:
the designated condition is that one of a refresh command and a refresh management command is sent to the memory region; and
the total number is produced by reducing the first fixed number by the second varying number; and
adjusting the value of the activate counter comprises decrementing the activate counter by the total number.

10. The method of claim 9, wherein the second varying number is selected from a numerical range comprising "1" to no greater than the first fixed number.

11. The method of claim 9, wherein the second varying number is selected from a numerical range comprising "1" to a value less than the first fixed number and selected to bias random variation of the activate counter adjustment toward a larger, and therefore less frequent, decrement.

12. The method of claim 8, wherein the first fixed number is a Rolling Accumulated ACT (RAA) decrement value provided in a control register.

13. The method of claim 8, wherein:
the designated condition is that an activate command is sent to the memory region; and
the first fixed number is "1", the second varying number is selected from a set of values including at least "0" and "1", and the total number is the first fixed number plus the second varying number; and
adjusting the value of the activate counter comprises adding the total number to the value of the activate counter.

14. A data processing system, comprising:
a data processor;
a data fabric coupled to the data processor; and
a memory controller coupled to the data fabric for fulfilling memory requests from the data processor, the memory controller comprising:
  a memory interface queue having an output coupled to a memory channel adapted for coupling to at least one dynamic random access memory (DRAM);
  an arbiter coupled to the memory interface queue for selecting memory commands and placing them in the memory interface queue to be transmitted over the memory channel;
  a refresh control circuit coupled to the arbiter and operable to monitor an activate counter which maintains a count related to a number of activate commands sent over the memory channel to a memory region, and in response to the activate counter being above a designated threshold, signal the arbiter that a refresh command should be sent to the memory region; and
  an activate counter adjustment circuit coupled to the activate counter and operable to respond to a designated condition by adjusting a value of the activate counter by a total number based on a first fixed number and second varying number selected with one of random selection and pseudo-random selection.

15. The data processing system of claim 14, wherein:
the designated condition is that one of a refresh command and a refresh management command is sent to the memory region; and
the total number is produced by reducing the first fixed number by the second varying number; and
adjusting the value of the activate counter comprises decrementing the activate counter by the total number.

16. The data processing system of claim 15, wherein the second varying number is selected from a numerical range comprising "1" to no greater than the first fixed number.

17. The data processing system of claim 15, wherein the second varying number is selected from a numerical range comprising "1" to a value less than the first fixed number and selected to bias random variation of the activate counter adjustment toward a larger, and therefore less frequent, decrement.

18. The data processing system of claim 14, wherein the first fixed number is a Rolling Accumulated ACT (RAA) decrement value provided in a control register for the memory controller.

19. The data processing system of claim 14, wherein:
the designated condition is that an activate command is sent to the memory region; and
the first fixed number is "1", the second varying number is selected from a set of values including at least "0" and "1", and the total number is the first fixed number plus the second varying number; and
adjusting the value of the activate counter comprises adding the total number to a previous value of the activate counter.

20. The data processing system of claim 14, further comprising a pseudo-random number generator (PRNG) coupled to the activate counter adjustment circuit for selecting the second varying number.

* * * * *